(12) United States Patent
Hackner

(10) Patent No.: US 7,327,157 B2
(45) Date of Patent: Feb. 5, 2008

(54) SWITCH DEVICE

(75) Inventor: Michael Hackner, Parsberg (DE)

(73) Assignee: Fraunhofer-Gesellschaft zur angewandten Forschung e.V., Munich (DE)

( * ) Notice: Subject to any disclaimer, the term of this patent is extended or adjusted under 35 U.S.C. 154(b) by 68 days.

(21) Appl. No.: 11/417,649

(22) Filed: May 4, 2006

(65) Prior Publication Data

US 2006/0261838 A1    Nov. 23, 2006

Related U.S. Application Data

(63) Continuation of application No. PCT/EP2004/010417, filed on Sep. 16, 2004.

(30) Foreign Application Priority Data

Nov. 4, 2003    (DE) .............................. 103 51 387

(51) Int. Cl.
*G01R 31/26*    (2006.01)
(52) U.S. Cl. ...................................... 324/768
(58) Field of Classification Search ............... None
See application file for complete search history.

(56) References Cited

U.S. PATENT DOCUMENTS

| | | | |
|---|---|---|---|
| 4,851,769 A | 7/1989 | Carpenter et al. | |
| 5,467,242 A | 11/1995 | Kiraly | |
| 6,587,050 B2 * | 7/2003 | Owen | 340/635 |
| 7,091,878 B2 * | 8/2006 | Holle et al. | 340/870.02 |

FOREIGN PATENT DOCUMENTS

| | | |
|---|---|---|
| DE | 43 20 021 A1 | 12/1993 |
| JP | 50 030481 A | 3/1975 |
| JP | 55 002918 A | 1/1980 |

OTHER PUBLICATIONS

Locci N. et al., "Measurement of Instantaneous Losses in Switching Power Devices" IEEE Transactions on Instrumentation and Measurement, IEEE Inc. New York, US, 37, No. 4, Dec. 1988, pp. 541-546.
"Simple Transistor Tester", Elektor Electronics, Elektor Publishers Ltd., Canterbury, GB, 21, No. 239, Dec. 1995, pp. 62.
Blaschke R., "Smart Transistor Tester", Elektor Electronics, Elektro Publishers Ltd., Canterbury, GB, 21, No. 239, Dec. 1995, pp. 24-29.

* cited by examiner

*Primary Examiner*—Ha Tran Nguyen
*Assistant Examiner*—Trung Q. Nguyen
(74) *Attorney, Agent, or Firm*—Daniel J. Santos

(57) ABSTRACT

A switch device includes a switch to be tested with a first terminal and a second terminal as well as a control terminal for controlling a resistance between the first terminal and the second terminal. Furthermore, the switch device includes a resistor as well as means for providing a measuring current across the resistor into the first terminal of the switch to be tested, wherein the control terminal and the first terminal of the switch to be tested are coupled in electrically conductive manner. Furthermore, the switch device includes means for sensing a voltage present due to the measuring current between the control terminal and the second terminal of the switch to be tested, wherein the voltage refers to an operability of the switch to be tested. With the switch device, in particular a greater number of potentially occurring errors of the switch to be tested can be detected as opposed to conventional switch devices.

11 Claims, 2 Drawing Sheets

US 7,327,157 B2

SWITCH DEVICE

CROSS-REFERENCE TO RELATED APPLICATION

This application is a continuation of International Application No. PCT/EP2004/010417, filed Sep. 16, 2004, which designated the United States and was not published in English and is incorporated herein by reference in its entirety, and which claimed priority to German Patent Application No. 10351387.6, filed on Nov. 4, 2003.

BACKGROUND OF THE INVENTION

1. Field of the Invention

The present invention relates to a switch device, and more specifically a switch device with a testing possibility for testing the operability of an electric switch.

2. Description of the Related Art

In protective circuits, often all components that switch power (switches) are subjected to a function test prior to being activated. By such a function test, errors leading to severe damage or destruction of the components of the circuit during the operation of the circuit can be recognized. In FIG. 2, such a conventional circuit (for example with a switching circuit or a converter) with overcurrent recognition is illustrated. The circuit according to FIG. 2 includes a voltage source 200 with a first terminal 202 and a second terminal 204. Furthermore, the circuit includes a resistor R and a diode D, wherein the diode D comprises a cathode K and an anode A. The resistor R is connected between the anode A and the first terminal 202 of the voltage source 200. Furthermore, the circuit comprises a switch S3 to be tested with a first terminal 206 and a second terminal 208 as well as a control terminal 210. The first terminal 206 of the switch S3 to be tested is conducively connected to the cathode K. The second terminal 208 of the circuit S3 to be tested is conducively connected to the second terminal 204 of the voltage source 200. The control terminal 210 of the switch S3 is conducively connected to a control output 212 of a drive circuit T, wherein the drive circuit T further comprises a first terminal 214 connected to the first terminal 202 of the voltage source 200 and a second terminal 216 connected to the second terminal 204 of the voltage source 200. The circuit according to FIG. 2 further comprises an input with a first input terminal 220 and a second input terminal 222. A capacitor 224 may be connected between the first input terminal 220 and the second input terminal 222. Furthermore, the circuit comprises an output with a first output terminal 230 and a second output terminal 232. Between the first output terminal 230 and the second output terminal 232, as illustrated in FIG. 2, a further diode D1 with a further cathode K1 and a further anode A1 may be connected, wherein the further cathode K1 is conducively connected to the first output terminal 230 and the further anode A1 to the second output terminal 232. Furthermore, the first input terminal 220 is conducively connected to the first terminal 206 of the switch S3 to be tested. The second terminal 208 of the switch S3 to be tested is conducively connected to the first output terminal 230. The second output terminal 232 is conducively connected to a first terminal 240 of a further switch S4, whereas the second input terminal 222 is conducively connected to a second terminal 242 of the further switch S4, wherein the further switch S4 additionally includes a control terminal 244. Furthermore, a switch device 250 is formed by the components of the voltage source 200, the drive circuit T, the resistor R, the diode D, and the switch S3 to be tested.

For a switch device 250 thus connected, there are several possibilities for monitoring the operability of the circuit or for monitoring the operability of the switch S3. For example, if an IGBT (isolated-gate bipolar transistor) is used as switch S3 to be tested, the gate-emitter voltage (voltage between the control terminal 210 of the switch S3 (measuring point G) and the second terminal 204 of the voltage source 200) and the collector sense voltage (voltage between the anode A of the diode D (measuring point C) and the second terminal 204 of the voltage source 200) are available as observable signals. If the gate (i.e. the control terminal 210 of the switch S3 to be tested) is controlled with 0V with reference to the emitter 208, the operable IGBT blocks, and the maximum voltage (i.e. the operative voltage of the drive circuit T or the maximum voltage of the voltage source 200 of 15V, for example) is present at the anode A. If the IGBT is turned on via the drive circuit, (i.e. for example 15V drop at the gate-emitter path) the collector-emitter path conducts, and the voltage that can be tapped at the measuring point C between the anode A and the diode D and the second terminal 204 of the voltage source 200 becomes lower, which can be detected by an on-the-fly testing means, for example. Alternatively, the on-the-fly testing means may also monitor a potential of the first terminal 206 of the switch S3 to be tested. With converters, by monitoring the measuring point C in the turned-on state, a too high collector-emitter current can be recognized. By turning the converter off, thermal destruction of the IGBT can be prevented in this case.

It proves disadvantageous, however, that some errors can indeed be recognized by this diagnosis (e.g. an open in the collector-emitter path), but not all occurring errors. For example, a short between gate and emitter cannot be recognized securely. Only if the short is significantly more low-ohmic than the gate driver, can this error be detected.

SUMMARY OF THE INVENTION

Hence, it is an object of the present invention to provide a switch device offering an improved possibility for recognizing errors of a switch to be tested, and thus offering higher reliability and enhanced availability of the switch device.

In accordance with a first aspect, the present invention provides a switch device, having: a switch to be tested with a first terminal and a second terminal as well as a control terminal for controlling a resistance between the first terminal and the second terminal; a resistor; a second switch connected between the control terminal and the first terminal of the switch to be tested, wherein the control terminal and the first terminal of the switch to be tested are coupled conducively when the second switch is closed; a drive circuit with a control output, wherein a control voltage for controlling the switch to be tested can be provided at the control output, and wherein the driver is formed to optionally switch the switch to be tested on or off, wherein the control voltage is present at the control output of the drive circuit, and wherein a third switch is connected between the control output of the drive circuit and the control terminal of the switch to be tested, wherein the control output of the drive circuit and the control terminal of the switch to be tested are conducively connected when the third switch is closed; a switch controller for controlling the second switch and the third switch, wherein the switch controller is formed to open the second switch and close the third switch in a first mode of operation, and close the second switch and open the third switch in a second mode of operation; and a sensor for sensing a voltage present due to a measuring current across the resistor into the first terminal of the switch to be tested between the control terminal and the second terminal of the switch to be tested, wherein the voltage refers to an operability of the switch to be tested.

In accordance with a second aspect, the present invention provides a controller, having: an input with a first input terminal and a second input terminal for applying an input voltage; an output with a first output terminal and a second output terminal for outputting an output voltage; a capacitor connected between the first input terminal and the second input terminal; a diode with a cathode and an anode, wherein the cathode is conducively connected to the first output terminal, and wherein the anode is conducively connected to the second output terminal of the switching circuit; a first switch device, having: a switch to be tested with a first terminal and a second terminal as well as a control terminal for controlling a resistance between the first terminal and the second terminal; a resistor; a second switch connected between the control terminal and the first terminal of the switch to be tested, wherein the control terminal and the first terminal of the switch to be tested are coupled conducively when the second switch is closed; a drive circuit with a control output, wherein a control voltage for controlling the switch to be tested can be provided at the control output, and wherein the driver is formed to optionally switch the switch to be tested on or off, wherein the control voltage is present at the control output of the drive circuit, and wherein a third switch is connected between the control output of the drive circuit and the control terminal of the switch to be tested, wherein the control output of the drive circuit and the control terminal of the switch to be tested are conducively connected when the third switch is closed; a switch controller for controlling the second switch and the third switch, wherein the switch controller is formed to open the second switch and close the third switch in a first mode of operation, and close the second switch and open the third switch in a second mode of operation; and a sensor for sensing a voltage present due to a measuring current across the resistor into the first terminal of the switch to be tested between the control terminal and the second terminal of the switch to be tested, wherein the voltage refers to an operability of the switch to be tested, wherein the first terminal of the switch to be tested is connected to the first input terminal in electrically conductive manner, and wherein the second terminal of the switch to be tested is connected to the first output terminal in electrically conductive manner; and a further switch device with a first terminal and a second terminal as well as a control terminal, wherein the first terminal of the further switch device is connected to the second output terminal and the second terminal of the further switch device to the second input terminal in electrically conductive manner, wherein a voltage at the input can be switched to the output of the switching circuit when the first switch device and the further switch device are connected through.

The present invention provides a switch device, comprising:
a switch to be tested with a first terminal and a second terminal as well as a control terminal for controlling a resistance between the first terminal and the second terminal;
a resistor;
a means for providing a measuring current across the resistor into the first terminal of the switch to be tested,
wherein the control terminal and the first terminal of the switch to be tested are coupled in electrically conductive manner; and
a means for sensing a voltage present due to the measuring current between the control terminal and the second terminal of the switch to be tested, wherein the voltage refers to an operability of the switch to be tested.

According to the invention, the above-described approach, in which monitoring a resistance between the first and the second terminal of the switch to be tested takes place by only applying voltage of the drive circuit to the control terminal of the switch to be tested, is abandoned. According to the invention, the control terminal and the first terminal of the switch to be tested are coupled in electrically conductive manner. For an electrically conductive coupling between the control terminal of the switch to be tested and the first terminal of the switch to be tested, a second switch is preferably employed here, wherein the coupling of the control terminal to the first terminal of the switch to be tested takes place by closing the second switch. Furthermore, preferably an electrically conductive connection between the control output of the above-described drive circuit and the control terminal of the switch to be tested is disconnected by an opened third switch, for example. The second switch and the third switch can be switched to a first and a second mode of operation, wherein the second switch is opened and the first switch closed in the first mode of operation, and the second switch closed and the third switch opened in the second mode of operation.

By such a connection, it is possible to check the operability of the switch to be tested like in an above-described switch device. At the same time, the present invention additionally offers the possibility to discover further errors of the switch to be tested (for example a short between the control terminal and the second terminal of the switch to be tested) that are not detectable by an above-described switch device.

Thus, the present invention offers the advantage of being able to completely test a switch to be tested for its operability. All potential errors can be detected by the present invention already prior to power-up of the switch to be tested. Thus, it is not required to wait for the failure case, at which greater damage might arise, during the operation of the switch to be tested when switching high powers. Thus, higher reliability and enhanced availability of the circuit can be expected. Furthermore, the present invention has the advantage that the alteration of a conventional circuit for testing the functionality can be realized only by simple circuit-technological measures, in particular by the use of two additional switch elements. The possibility of the recognition of further errors thus only requires little overhead.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
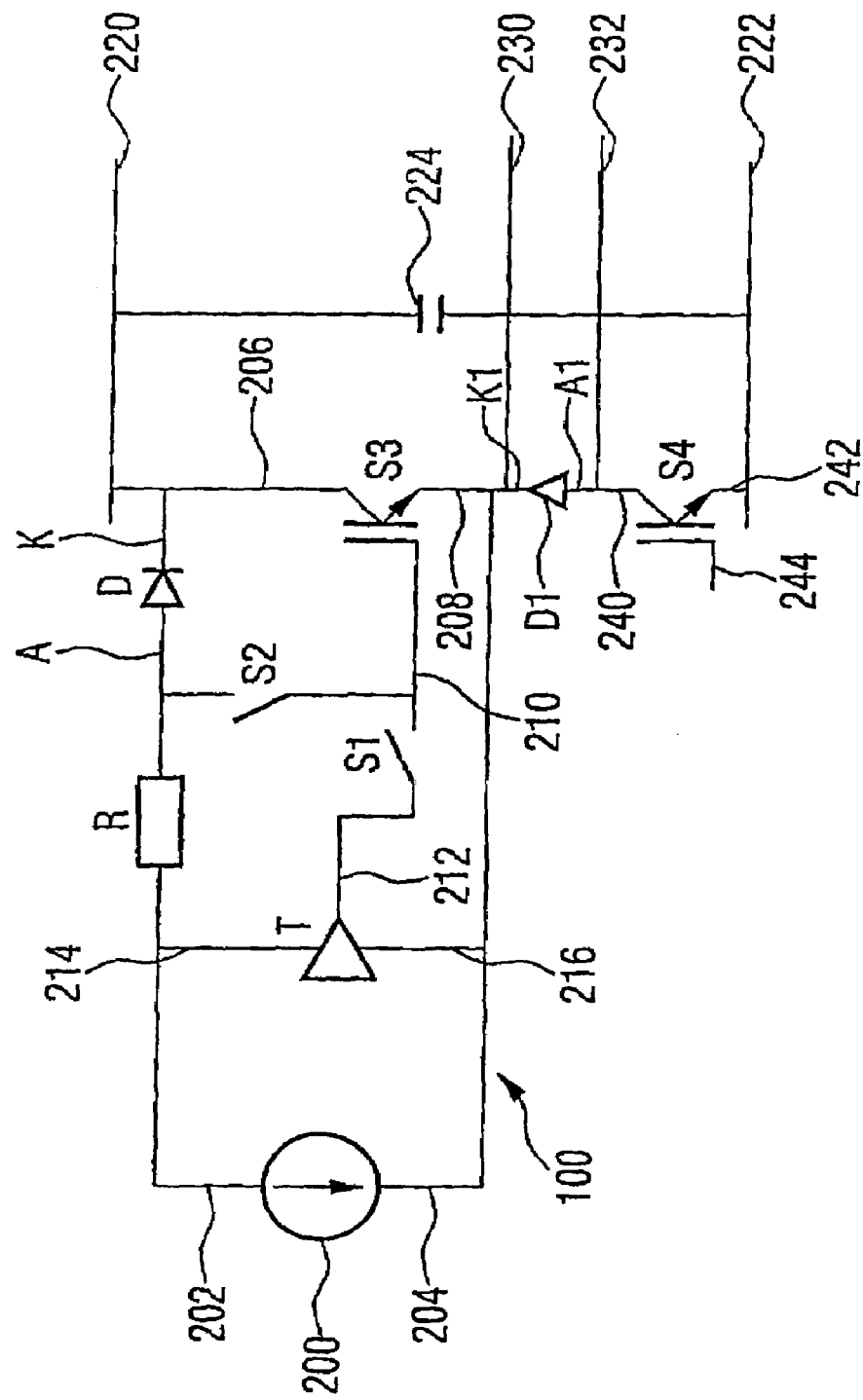
FIG. 1 shows a circuit topology of a controller including a switch device according to a preferred embodiment of the present invention.

In the subsequent description of the preferred embodiment of the present invention, the same reference numerals will be used for similarly acting elements illustrated in the various drawings.

Figure 2:
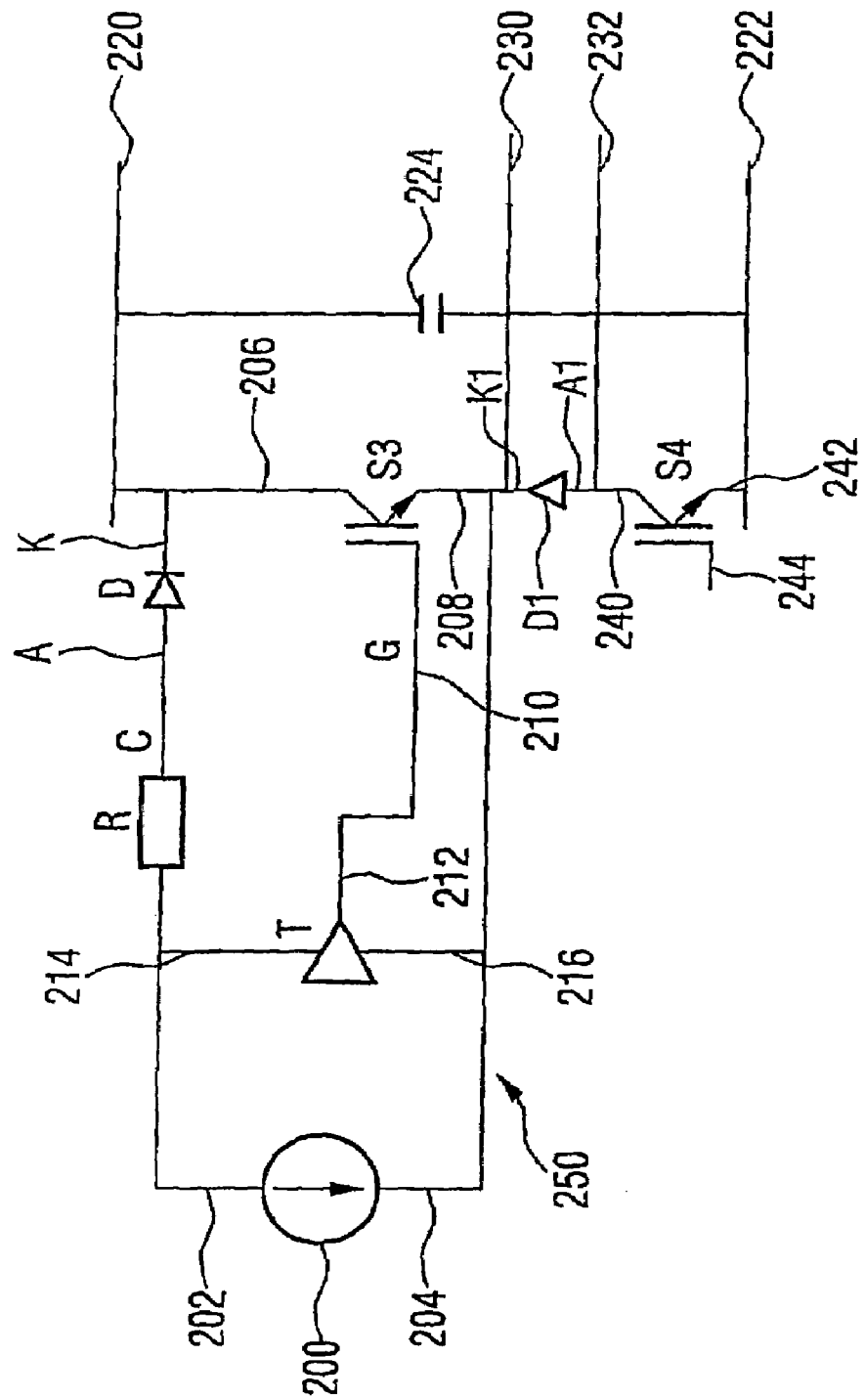
FIG. 2 shows a circuit topology of a controller including a conventional switch device.

In FIG. 1, the circuit topology of a controller (switching circuit) is illustrated using a preferred embodiment of a switch device 100 according to the invention. The circuit topology of the preferred embodiment of the switch device 100 according to the invention substantially corresponds to the switch device 250 shown in FIG. 2. In contrast to the switch device 250 shown in FIG. 2, the switch device 100 illustrated in FIG. 1 comprises a second switch S2 connected between the anode A of the diode D and the control terminal 210 of the switch S3 to be tested. Furthermore, the switch device 100 comprises a third switch S1 connected between the control output 212 of the drive circuit T and the control terminal 210 of the switch S3 to be tested. The second switch S2 and the third switch S1 can each be switched to a closed and an opened state. By a switch control means not illustrated in FIG. 1, the second switch S2 and the third switch S1 can be switched to a first mode of operation and a second mode of operation, wherein the second switch S2 is opened and the third switch S1 is closed in the first mode of operation, and the second switch S2 is closed and the third switch S1 is opened in the second mode of operation. The switch control means is further formed to be in the first mode of operation when the switch S3 to be tested is in the normal operation, and to be in the second mode of operation when the switch to be tested is in a test operation. Here, the test operation is characterized in that no voltage is present between the first input terminal 220 and the second input terminal 222 of the switching circuit. For example, if an IGBT with a collector as first terminal 206, an emitter as second terminal 208, and a gate as control terminal 210 is used for the switch S3 to be tested, the operability of the IGBT S3 with reference to the collector-emitter path can be tested in the normal operation by the voltage provided from the voltage source 200 (for example 15V). For example, if a voltage by which the IGBT is blocked is applied at the control terminal 210 of the IGBT S3 to be tested by the drive circuit T, no current flows between the collector 206 and the emitter 208, whereby no voltage drops at the resistor R, and thus the maximum voltage of the voltage source 200 of 15V, for example, is present at the measuring point C. If a voltage by which the IGBT S3 is connected through at the control terminal 210 of the IGBT S3 (i.e. the gate of the IGBT S3) by the driver, current (measuring current) flows between the collector 206 and the emitter 208. The measuring current caused by the voltage of the voltage source 200, which flows through the resistor R, the diode D, as well as the IGBT S3, leads to a voltage drop at the resistor R. Hereby, only a voltage reduced as opposed to the maximum voltage of the voltage source 200 is present at the measuring point C, which can be detected by a means for sensing a voltage present due to a measuring current not illustrated here. By evaluating the detected voltage at the measuring point C, it can thus be recognized whether the IGBT S3, for example, has an open error in the collector-emitter path (no decrease in the voltage at the measuring point C with through-connected IGBT S3) or a short error in the collector-emitter path (decrease in the voltage at the measuring point C with blocked IGBT S3).

Apart from the first mode of operation in which errors of the IGBT S3 to be tested can be tested with the above-described conventional method, the second mode of operation can also be adjusted by the switch control means when the switch S3 to be tested is in the test operation. Here, the measuring point C is conducively connected to the control terminal 210 of the switch S3 to be tested (i.e. for example the gate of the IGBT to be tested). If a voltage (for example 15V) is applied to the switch device 100 according to the invention by the voltage source 200 in the opened state of all other switches (i.e. of the third switch S1 and the further switch device S4), hereby a measuring current flowing across the resistor R, the diode D, and the switch S3 to be tested results. By the control terminal 210 of the switch S3 to be tested being conducively connected to the anode A by the second switch S2, a control loop ensuring that a predefined threshold voltage develops in an operative switch S3 to be tested at the control terminal 210 of the switch S3 to be tested is formed by such a connection. For example, if the switch S3 to be tested is a transistor (such as MOSFET=metal oxide semiconductor field effect transistor, IGBTs, bipolar transistors, or the like), the predefined threshold voltage corresponds to the corresponding transistor threshold voltage. In the presence of an error between the gate 210 and the emitter 208 of an IGBT S3 to be tested, the voltage present at the measuring point G is smaller than the transistor threshold voltage of the IGBT used. Via a means for sensing voltage present due to a measuring current between the control terminal 210 and the further terminal 208 of the switch S3 to be tested, which is not illustrated here, the voltage present between the measuring point G and the second terminal 208 of the switch S3 to be tested can thus be detected and interpreted with respect to an error in the gate-emitter path.

By such a switching possibility between the first and the second mode of operation, as opposed to a conventional switch device, a switch S3 to be tested can be tested completely in the test operation. In particular, a short or open error between the collector 206 and the emitter 208, as well as additionally a short between the gate 210 and the emitter 208 can be recognized hereby. The greatest short resistance detectable is thus not defined by the output resistor of the gate driver, but by the resistor by which the measuring point C is connected to a supply voltage of the gate driver (i.e. the voltage of the voltage source 200).

By such a complete function test of an IGBT S3 to be tested in the switching circuit illustrated in FIG. 1, it can thus be ensured that the IGBT provided as switch S3 is fully functional. Thus, it can be ensured that at a transition from the test operation to the normal operation (i.e. for example when connecting a DC voltage between the first input terminal 220 and the second input terminal 222 to the output), at simultaneous switching from the second mode of operation to the first mode of operation, it is guaranteed that the IGBT S3 employed as switch functions correctly and a failure of the switch device 100 is not to be expected.

As an alternative to the third switch S3, which may for example be formed as a low-ohmic analog switch (for example as a pushbutton) (as illustrated in FIG. 1), a drive circuit with a tristate output may also be used for the realization of the function of the third switch. Here, by a further switch, the signal provided by the drive circuit is to be separated from the control terminal of a switch to be tested by deactivating (i.e. switching in high-ohmic manner as opposed to a low-omic active state) the tristate output of the drive circuit via the further switch.

Although a preferred embodiment of the present invention has been explained in greater detail above, it is apparent that the present invention is not limited to this embodiment. In particular, the present invention can also be applied to further electronic devices with a first and a second terminal as well as a control terminal, with particular reference being made to the device types of a MOSFET and a bipolar transistor. Furthermore, the present switching circuit is not limited to the use of only a single switch device according to the invention.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A switch device, comprising:
   a switch to be tested with a first terminal and a second terminal as well as a control terminal for controlling a resistance between the first terminal and the second terminal;
   a resistor;
   a second switch connected between the control terminal and the first terminal of the switch to be tested, wherein the control terminal and the first terminal of the switch to be tested are coupled conductively when the second switch is closed;
   a drive circuit with a control output, wherein a control voltage for controlling the switch to be tested can be provided at the control output, and wherein the driver is formed to optionally switch the switch to be tested on or off, wherein the control voltage is present at the control output of the drive circuit, and wherein a third switch is connected between the control output of the drive circuit and the control terminal of the switch to be tested, wherein the control output of the drive circuit and the control terminal of the switch to be tested are conductively connected when the third switch is closed;
   a switch controller for controlling the second switch and the third switch, wherein the switch controller is formed to open the second switch and close the third switch in a first mode of operation, and close the second switch and open the third switch in a second mode of operation; and
   a sensor for sensing a voltage present due to a measuring current across the resistor into the first terminal of the switch to be tested between the control terminal and the second terminal of the switch to be tested, wherein the voltage refers to an operability of the switch to be tested.

2. The switch device of claim 1, further comprising:
   an analyzer for recognizing the switch to be tested as defective, wherein the analyzer is formed to compare the voltage between the control terminal and the second terminal of the switch to be tested with a predetermined threshold voltage.

3. The switch device of claim 2, wherein the analyzer is formed to recognize the switch to be tested as defective if the voltage is smaller than the predetermined threshold voltage.

4. The switch device of claim 2, wherein the switch to be tested is a transistor with a transistor threshold voltage, wherein the predetermined threshold voltage is equal to the transistor threshold voltage.

5. The switch device of claim 1, wherein the third switch is formed by a tristatable control output of the drive circuit.

6. The switch device of claim 1, wherein the switch controller is formed to be in the first mode of operation when the switch to be tested is in a normal operation, and to be in the second mode of operation when the switch to be tested is in a test operation.

7. The switch device of claim 6, wherein the test operation of the switch to be tested is present when no voltage is present between the first input terminal and the second input terminal of the switch device.

8. The switch device of claim 7, wherein the switch controller is formed to be in the first mode of operation, and further comprising:
   an on-the-fly tester for recognizing the switch as defective, wherein the on-the-fly tester is formed to detect a potential of the first terminal of the switch to be tested and assess the switch to be tested in dependence thereof.

9. The switch device of claim 1, wherein a diode can be connected between the control terminal and the first terminal of the switch to be tested, wherein a cathode of the diode is conducively connected to the first terminal of the switch to be tested and an anode of the diode can be conducively connected to the control terminal of the switch to be tested.

10. The switch device of claim 9, wherein the resistor is connected between the anode and the measuring current supplier, wherein the measuring current supplier comprises a first terminal and a second terminal, to which a voltage can be applied, wherein the first terminal is connected to the resistor and the second terminal is connected to the second terminal of the switch to be tested.

11. A controller, comprising:
    an input with a first input terminal and a second input terminal for applying an input voltage;
    an output with a first output terminal and a second output terminal for outputting an output voltage;
    a capacitor connected between the first input terminal and the second input terminal;
    a diode with a cathode and an anode, wherein the cathode is conducively connected to the first output terminal, and wherein the anode is conducively connected to the second output terminal of the switching circuit;
    a first switch device, comprising:
       a switch to be tested with a first terminal and a second terminal as well as a control terminal for controlling a resistance between the first terminal and the second terminal;
       a resistor;
       a second switch connected between the control terminal and the first terminal of the switch to be tested, wherein the control terminal and the first terminal of the switch to be tested are coupled conducively when the second switch is closed;
       a drive circuit with a control output, wherein a control voltage for controlling the switch to be tested can be provided at the control output, and wherein the driver is formed to optionally switch the switch to be tested on or off, wherein the control voltage is present at the control output of the drive circuit, and wherein a third switch is connected between the control output of the drive circuit and the control terminal of the switch to be tested, wherein the control output of the drive circuit and the control terminal of the switch to be tested are conducively connected when the third switch is closed;
       a switch controller for controlling the second switch and the third switch, wherein the switch controller is formed to open the second switch and close the third switch in a first mode of operation, and close the second switch and open the third switch in a second mode of operation; and a sensor for sensing a voltage present due to a measuring current across the resistor into the first terminal of the switch to be tested between the control terminal and the second terminal of the switch to be tested, wherein the voltage refers to an operability of the switch to be tested, wherein the first terminal of the switch to be tested is connected to the first input terminal in electrically conductive manner, and wherein the second terminal of the switch to be tested is connected to the first output terminal in electrically conductive manner; and a further switch device with a first terminal and a second terminal as well as a control terminal, wherein the first terminal of the further switch device is connected to the second output terminal and the second terminal of the further switch device to the second input terminal in electrically conductive manner, wherein a voltage at the input can be switched to the output of the switching circuit when the first switch device and the further switch device are connected through.

* * * * *